United States Patent [19]

Terashima

[11] Patent Number: 4,984,063
[45] Date of Patent: Jan. 8, 1991

[54] SEMICONDUCTOR DEVICE

[75] Inventor: Tomohide Terashima, Itami, Japan

[73] Assignee: Mitsubishi Denki Kabushiki Kaisha, Japan

[21] Appl. No.: 387,762

[22] Filed: Aug. 1, 1989

[30] Foreign Application Priority Data

Mar. 30, 1989 [JP] Japan ................................ 1-76832

[51] Int. Cl.⁵ .................. H01L 23/28; H01L 23/30
[52] U.S. Cl. ........................................ 357/72; 357/81
[58] Field of Search ................................ 357/72, 81

[56]        References Cited
         U.S. PATENT DOCUMENTS 4,546,374 10/1985 Olsen et al. ........................ 357/72
4,712,127 12/1987 Colombo et al. .................. 357/72

FOREIGN PATENT DOCUMENTS 0158171   12/1979 Japan .
54-158171 12/1979 Japan ................................ 357/72
56-45054   4/1981 Japan ................................ 437/215
56-48160   5/1981 Japan .
0124249    9/1981 Japan .
57-84157   5/1982 Japan .
0101443    6/1983 Japan .
0099747    6/1984 Japan .
59-152653  8/1984 Japan ................................ 357/72
0187259    8/1986 Japan .
0251156   11/1986 Japan ................................ 357/72
0192257    8/1988 Japan .
2059157    4/1981 United Kingdom .

Primary Examiner—Andrew J. James
Assistant Examiner—Viet Q. Nguyen
Attorney, Agent, or Firm—Leydig, Voit & Mayer

[57]            ABSTRACT

A semiconductor device chip holder which has a plurality of plates laminated together, each having a different thermal expansion coefficient. A semiconductor chip is mounted on the upper surface of the chip holder, and molding resin is disposed only on the upper side of the chip holder encapsulating the semiconductor chip. At high temperatures the bimetal effect due to this construction causes the chip holder to warp, which generates a stress acting on the semiconductor chip compressing it. The piezoresistance effect thus obtained reduces the on-resistance of the semiconductor chip, thereby enabling the device to exhibit a stable and low on-resistance over a wide temperature range.

23 Claims, 4 Drawing Sheets

SEMICONDUCTOR DEVICE

BACKGROUND OF THE INVENTION

1. FIELD OF THE INVENTION

This invention relates to a semiconductor device, and in particular, to a semiconductor device which exhibits satisfactory properties over a wide temperature range.

2. DESCRIPTION OF THE RELATED ART

FIG. 6 is a sectional view of a conventional discrete device employing a power MOSFET. FIG. 7 is a plan view of the device of FIG. 6 before resin molding. The device shown includes a semiconductor chip 1 mounted on a chip holder 5 made of a metal plate. Formed on the lower surface of the semiconductor chip 1 which is connected to the chip holder 5 is a drain electrode (not shown), which is electrically connected to the chip holder 5. Formed on the upper surface of the semiconductor chip 1 are a gate electrode 3 and a source electrode 4 which are respectively connected through wires 2 to a gate electrode lead 7 and a source electrode lead 8. The gate electrode lead 7 and the source electrode lead 8 are isolated from the chip holder 5, and are electrically insulated therefrom. The chip holder 5 includes a drain electrode lead 9 which is formed integrally therewith. The semiconductor chip 1, the wires 2 and part of the leads 7 to 9 are sealed with molding resin 6. To enhance the heat radiating property of the discrete device, the molding resin 6 is only provided on the upper side of the chip holder 5, the lower side thereof being exposed toward the outside.

When using this discrete device, a voltage of several tens to several hundreds of volts is applied between the source electrode 4 and the drain electrode of the semiconductor chip 1 through the source electrode lead 8 and the drain electrode lead 9. As long as no voltage is applied to the gate electrode 3, the discrete device remains in the off-state, retaining the voltage between the source and drain electrodes. When a voltage of several volts is applied to the gate electrode 3, the discrete device is switched to the on-state. A current then flows between the source electrode 4 and the drain electrode, in a direction perpendicular to the upper and lower surfaces of this discrete device.

Generally speaking, the molding resin 6 contracts when cooled, so that, at room temperature, a contracting force F6 shown in FIG. 8 is acting on the molding resin 6. As stated above, this molding resin 6 is only provided on the upper side of the chip holder 5, so that the contracting force F6 generates a stress F5 which warps the chip holder 5. The lower side of the chip holder 5, on which no molding resin 6 is disposed, will then become convex. As a result, a stress F1 acts on the semiconductor chip 1 mounted on the chip holder 5 compressing it. The on-resistance of the semiconductor chip 1 is then reduced due to the piezoresistance effect thus obtained, thereby improving the electric characteristics of the discrete device.

However, when the molding resin 6 expands due to temperature rise, the stress F1 which has been acting on the semiconductor chip 1 is mitigated; in some cases, it can be cancelled, as shown in FIG. 9. As a result, the on-resistance of the semiconductor chip 1 becomes greater than at room temperature.

An experiment using two types of semiconductor devices A and B was conducted for the purpose of examining the influence of the piezoresistance effect on their on-resistance. As shown in FIG. 10A, a first type of semiconductor device A which includes a semiconductor chip 1 made of Si and mounted on a copper-type alloy plate 11, was prepared the semiconductor chip 1 being sealed with molding resin 6 disposed on the upper side of the copper-type alloy plate 11. On the other hand, a second type of semiconductor device B which included a semiconductor chip 1 that was the same as that used in the first type of semiconductor device A was prepared. This semiconductor chip 1 was mounted on a copper plate 12 which was connected to a ceramic plate 13, without resin molding the semiconductor chip 1. The semiconductor device A has a construction similar to that of FIG. 6. Accordingly, a stress F1 is acting at room temperature on its semiconductor chip 1, as shown in FIG. 8. In contrast, the other semiconductor device B employs a mechanically firm ceramic plate 13, without resin molding. Consequently, practically no stress is acting on its semiconductor chip 1, as in the semiconductor device at high temperature shown in FIG. 9.

The respective on-resistance/withstand-voltage characteristics of these semiconductor devices A and B were measured at room temperature under, for example, a condition in which the the gate-source voltage $V_{GS}=10$ V and the drain current $I_D=5$ A. FIG. 11 shows the results of the measurement. In this figure, the symbols O and X represent the semiconductor devices A and B, respectively. As will be appreciated from these results, the reduction in on-resistance in the semiconductor device A, whose semiconductor chip 1 is under the action of the stress F1, was as much as 14% compared to the semiconductor device B, whose semiconductor chip 1 is under no stress.

This experiment shows that the conventional semiconductor device shown in FIG. 6 involves a greater on-resistance at high temperature than at room temperature. Thus, as suggested by this example, the on-resistance in conventional semiconductor devices is much dependent on temperature, resulting in poor reliability.

SUMMARY OF THE INVENTION

This invention aims at eliminating the above-mentioned problem experienced with conventional semiconductor devices. Accordingly, it is an object of this invention to provide a semiconductor device which exhibits a stable and low on-resistance over a wide temperature range.

In accordance with this invention, there is provided a semiconductor device comprising a chip holding means having a plurality of plates which have different thermal expansion coefficients and which are laminated together, a semiconductor chip mounted on the chip holding means, and molding resin disposed on the chip holding means and sealing the semiconductor chip.

DESCRIPTION OF THE PREFERRED EMBODIMENTS

Embodiments of this invention will now be described with reference to the accompanying drawings.

Figure 1:
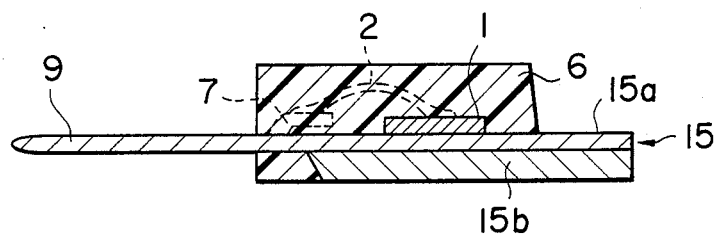
FIG. 1 is a sectional view of a semiconductor device in accordance with an embodiment of this invention.
Figure 2:
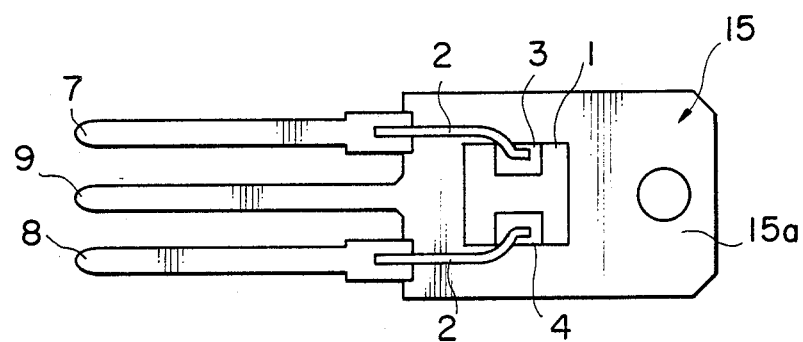
FIG. 2 is a plan view of the semiconductor device of FIG. 1 before resin molding.

The semiconductor device shown in FIG. 1 includes a flat chip holder 15 to the upper surface of which is fixed a semiconductor chip 1 by means of soldering or a conductive adhesive agent. The chip holder 15 comprises a pair of metal plates 15a and 15b which are laminated together by means of brazing and which have different thermal expansion coefficients. The upper metal plate 15a to which the semiconductor chip 1 is connected is made of an iron-type alloy, tungsten, molybdenum, or an alloy thereof, etc., the lower metal plate 15b being made of a copper-type alloy. With this arrangement of materials, the thermal expansion coefficient of the upper metal plate 15a is smaller than that of the lower metal plate 15b, and the thickness of the upper metal plate 15a is no larger than the thickness of the lower metal plate 15b.

The semiconductor chip 1 includes an Si substrate, for example. A gate electrode 3 and a source electrode 4 are formed on the upper surface of the Si substrate and a drain electrode (not shown) is formed on the lower surface thereof. The drain electrode is electrically connected through solder or a conductive adhesive agent to the metal plate 15a of the chip holder 15. On the other hand, the gate and source electrodes 3 and 4 formed on the upper surface of the semiconductor chip 1 are connected through respective wires 2 to a gate electrode lead 7 and a source electrode lead 8, respectively. The gate electrode and source electrode leads 7 and 8 are isolated from the chip holder 15, and are electrically insulated therefrom. A drain electrode lead 9 is formed integrally with the upper metal plate 15a of the chip holder 15, and protrudes therefrom parallel to the gate electrode and source electrode leads 7 and 8. The semiconductor chip 1, the wires 2 and part of the leads 7 to 9 are encapsulated with a molding resin 6. To enhance the heat radiating property of this discrete device, the molding resin 6 is disposed only on the upper side of the chip holder 15, the lower surface of the chip holder 15 being exposed toward the outside.

The operation of this semiconductor device will now be described.

When using this discrete device, a voltage of several tens to several hundreds of volts is applied between the source electrode 4 and the drain electrode (not shown) of the semiconductor chip 1 through the source electrode lead 8 and the drain electrode lead 9. As long as no voltage is applied to the gate electrode 3, the discrete device remains in the off-state, retaining the voltage between the source and drain electrodes. When a voltage of several volts is applied to the gate electrode 3, the discrete device is switched to the on-state. A current then flows between the source electrode 4 and the drain electrode, in the direction perpendicular to the upper and lower surfaces of this discrete device.

Figure 3:
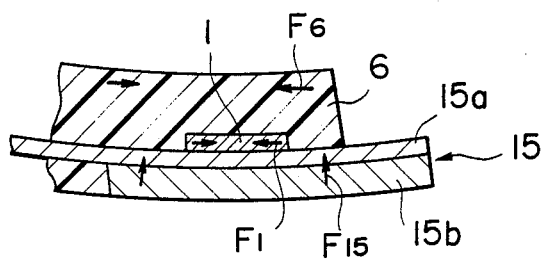
FIGS. 3 and 4 are sectional views showing the stress acting on the semiconductor chip of FIG. 1 at room and high temperatures, respectively.

Now, the molding resin 6 disposed on the chip holder 15 at the time of resin sealing contracts when cooled, so that, at room temperature, a contracting force F6 shown in FIG. 3 is acting on the molding resin 6. As stated above, this molding resin 6 is disposed only on the upper side of the chip holder 15, so that the contracting force F6 generates a stress F15 which wraps the chip holder 15 it. The lower side of the chip holder 15, on which no molding resin 6 is disposed, will then become convex. As a result, a stress F1 acts on the semiconductor chip 1 mounted on the chip holder 15 compressing it. The on-resistance of the semiconductor chip 1 is then reduced due to the piezoresistance effect thus obtained.

Figure 4:
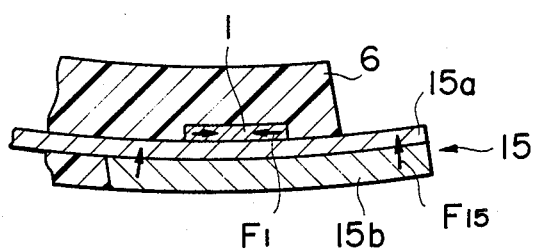

When the temperature rises as the semiconductor device is driven or when it is used in a high-temperature environment, the molding resin 6 expands, causing the contracting force F6 which has been acting on the molding resin 6 to be mitigated. Since, however, the structure of the chip holder 15 comprises two metal plates 15a and 15b which have different thermal expansion coefficients and which are laminated together, any temperature rise causes the chip holder 15 to warp due to the bimetal effect. As stated above, the thermal expansion coefficient of the upper metal plate 15a is smaller than that of the lower metal plate 15b. Accordingly, at high temperature, a stress F15 causes the chip holder 15 to warp in such a manner that the lower side thereof, on which no molding resin is disposed, becomes convex, as shown in FIG. 4. As a result, a stress F1 acts on the semiconductor chip 1 mounted on the chip holder 15 compressing it, as at room temperature, and the on-resistance of the semiconductor chip 1 is reduced due to the piezoresistance effect thus obtained.

Thus, in this construction, a stress acts on the semiconductor chip 1 at high temperature as well as at room temperature, whereby a semiconductor device is obtained which exhibits a low on-resistance over a wide temperature range.

The copper-type alloy employed in the lower metal plate 15b of the chip holder 15 has thermal that is higher than that of any of the above-mentioned metals in the upper metal plate 15a. Accordingly, it is desirable that the thickness of the upper metal plate 15a be no more than half that of the lower metal plate so that the heat radiating property of the device may be enhanced.

While in the above embodiment the stress F1 is caused to act on the semiconductor chip 1 by warping of the chip holder 15 which is effected at high temperature such that the lower side thereof becomes convex, the warping may also be caused by the upper side of the chip holder 15 becoming convex. That is, the thermal expansion coefficient of the upper metal plate 15a of the chip holder 15 may be set greater than that of the lower metal plate 15b. In that case, the bimetal effect of the chip holder 15 at high temperature will work to cancel the contracting force of the molding resin 6. If, however, the compressive stress due to the bimetal effect of the chip holder 15 acts on the semiconductor chip 1 within the use temperature range of the semiconductor device, reduction in on-resistance can be attained.

Figure 5:
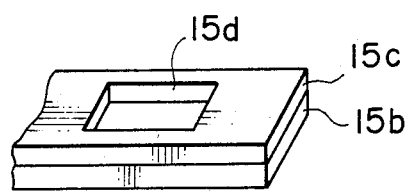
FIG. 5 is a perspective view showing the essential part of another embodiment of this invention.
Figure 6:
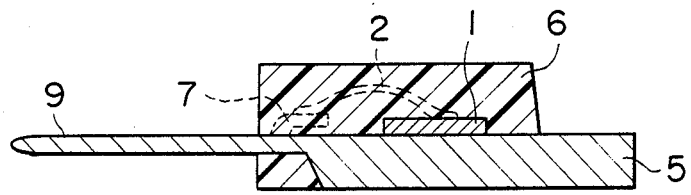
FIG. 6 is a sectional view of a conventional semiconductor device.
Figure 7:
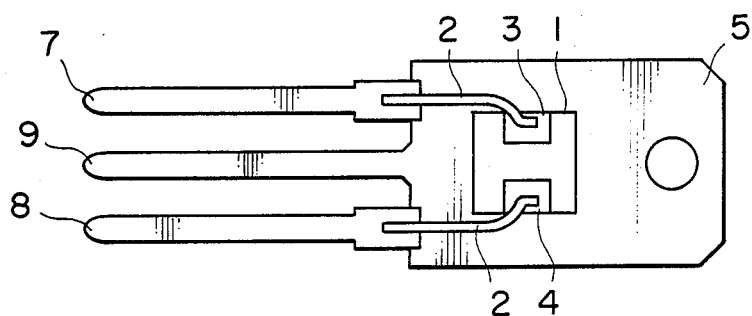
FIG. 7 is a plan view of the semiconductor device of FIG. 6 before resin molding.
Figure 8:
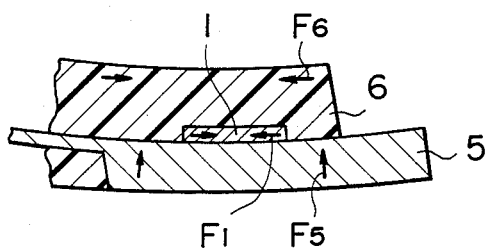
FIGS. 8 and 9 are sectional views showing the stress acting on the semiconductor chip of FIG. 6 at room and high temperatures, respectively.
Figure 9:
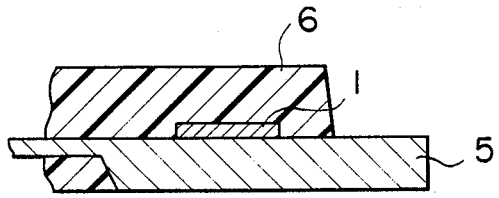
Figure 10A:
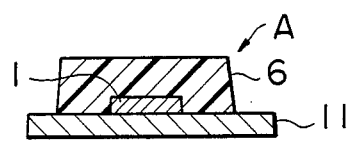
FIGS. 10A and 10B are sectional views of semiconductor devices used in an experiment conducted for the purpose of examining the influence of the piezoresistance effect on the on-resistance in semiconductor devices.
Figure 10B:
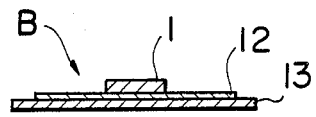
Figure 11:
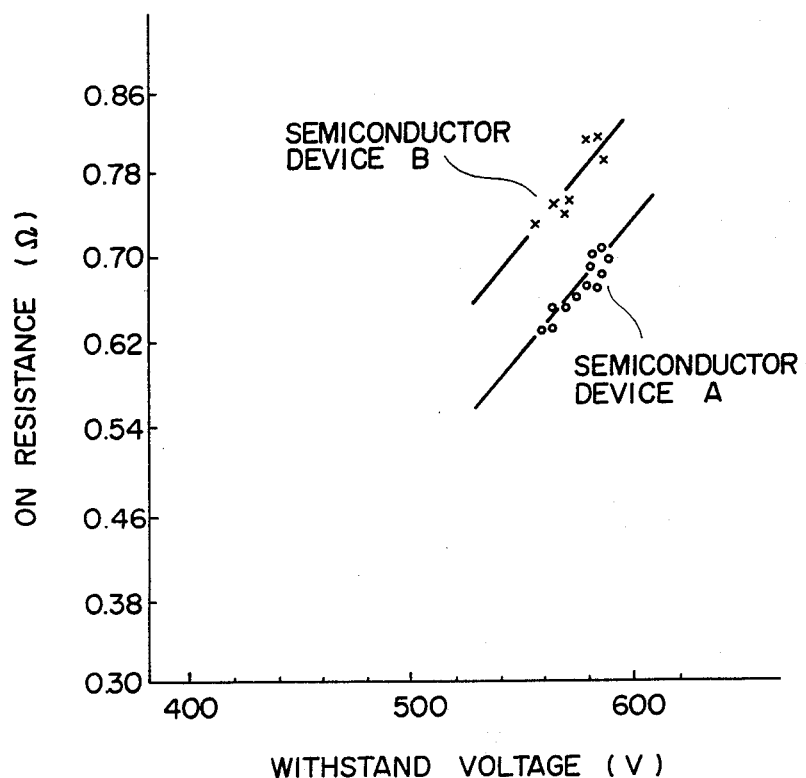
FIG. 11 is a graph showing the on-resistance/withstand-voltage characteristics of the semiconductor devices of FIGS. 10A and 10B.

Instead of mounting a semiconductor chip 1 on the upper metal plate 15a of the chip holder 15, the semiconductor chip 1 may, as shown in FIG. 5, be mounted on the lower metal plate 15b within an opening 15d in an upper metal plate 15c. This arrangement facilitates the escape of the heat generated in the semiconductor chip 1 toward the outside through the lower metal plate 15b, thereby improving the heat radiating property of the device.

This invention can be applied to various types of semiconductor devices, including MOSFET, SIT, monopolar device, bulk effect device, etc.

What is claimed is:

1. A semiconductor device comprising:
   a bimetallic chip holding means having opposed first and second surfaces and including first and second metal plates laminated together and having different coefficients of thermal expansion, said first plate being disposed at the first surface and said second plate being disposed at the second surface, said bimetallic chip holding means bending in response to changes in temperature;
   a semiconductor chip mounted on the first surface of said chip holding means; and
   a molding resin disposed on the first surface of said chip holding means encapsulating said semiconductor chip.

2. A semiconductor device as claimed in claim 1 wherein said second plate has a larger coefficient of thermal expansion than said first plate so that the second surface becomes increasingly convex with increasing temperature.

3. A semiconductor device as claimed in claim 1 wherein said molding resin is applied to said semiconductor chip at an elevated temperature and contracts upon cooling, thereby applying a compressive force to said chip at room temperature.

4. A semiconductor device as claimed in claim 1, wherein said second metal plate is a copper alloy.

5. A semiconductor device as claimed in claim 3, wherein said first metal plate is an iron alloy.

6. A semiconductor device as claimed in claim 3, wherein said first metal plate is tungsten.

7. A semiconductor device as claimed in claim 3, wherein said first metal plate is molybdenum.

8. A semiconductor device as claimed in claim 1, wherein the thickness of said first metal plate is not more than that of said second metal plate.

9. A semiconductor device comprising:
   a bimetallic chip holding means having opposed first and second surfaces and including first and second metal plates laminated together and having different coefficients of thermal expression, said first metal plate including an opening, said first plate being disposed at the first surface and said second plate being disposed at the second surface, said bimetallic chip holding means bends in response to changes in temperature;
   a semiconductor chip mounted on said second metal plate within the opening; and
   a molding resin disposed on the first surface of said chip holding means encapsulating said semiconductor chip.

10. A semiconductor device as claimed in claim 1 wherein said semiconductor chip has opposed first and second chip surfaces and a first and a second electrode means respectively disposed on said first and second chip surfaces for conducting a current flow.

11. A semiconductor device as claimed in claim 7, wherein said chip holding means is electrically connected to the second electrode means of said semiconductor chip.

12. A semiconductor device as claimed in claim 8 comprising first lead means electrically connected to the first electrode means of said semiconductor chip having a tip section extending outwards from said molding resin.

13. A semiconductor device as claimed in claim 9 comprising second lead means integrally formed with said chip holding means having a tip section extending outwards from said molding resin and said chip holding means.

14. A semiconductor device as claimed in claim 1 wherein said molding resin is disposed only on the first surface of said chip holding means.

15. A semiconductor device as claimed in claim 1 wherein said molding resin is not disposed on the second surface of said chip holding means.

16. A semiconductor device as claimed in claim 4 wherein said first plate has a thickness not more than half of that of the second plate.

17. A semiconductor device as claimed in claim 1 wherein said first plate has a larger coefficient of thermal expansion than said second plate so that the first surface becomes increasingly convex with increasing temperature.

18. A semiconductor device as claimed in claim 12 wherein said second metal plate is a copper alloy.

19. A semiconductor device as claimed in claim 18 wherein said first metal plate is an iron alloy.

20. A semiconductor device as claimed in claim 18 wherein said first metal plate is tungsten.

21. A semiconductor device as claimed in claim 18 wherein said first metal plate is molybdenum.

22. A semiconductor device as claimed in claim 12 wherein said first metal plate has a thickness not more than half of that of the second metal plate.

23. A semiconductor device as claimed in claim 12 wherein said molding resin is not disposed on the second surface of said chip holding means.

* * * * *

UNITED STATES PATENT AND TRADEMARK OFFICE
CERTIFICATE OF CORRECTION

PATENT NO. : 4,984,063

DATED : January 8, 1991

INVENTOR(S) : Tomohide Terashima

It is certified that error appears in the above-identified patent and that said Letters Patent is hereby corrected as shown below:

Claim 9, column 5, line 52, change "expression" to --expansion--.

Claim 11, column 6, line 13, change "7" to --10--;

Claim 12, column 6, line 17, change "8" to --11--;

Claim 13, column 6, line 22, change "9" to --12--;

Claim 18, column 6, line 41, change "12" to --9--;

Claim 22, column 6, line 49, change "12" to --9--;

Claim 23, column 6, line 52, change "12" to --9--.

Signed and Sealed this

Eleventh Day of August, 1992

Attest:

DOUGLAS B. COMER

*Attesting Officer*    Acting Commissioner of Patents and Trademarks